United States Patent
Kosaka (10) Patent No.: US 8,455,951 B2
(45) Date of Patent: Jun. 4, 2013

(54) SEMICONDUCTOR DEVICE

(75) Inventor: Toshiyuki Kosaka, Kanagawa (JP)

(73) Assignee: Sumitomo Electric Device Innovations, Inc., Yokohama-shi, Kanagawa (JP)

( * ) Notice: Subject to any disclaimer, the term of this patent is extended or adjusted under 35 U.S.C. 154(b) by 249 days.

(21) Appl. No.: 12/950,493

(22) Filed: Nov. 19, 2010

(65) Prior Publication Data

US 2011/0084341 A1    Apr. 14, 2011

Related U.S. Application Data

(63) Continuation of application No. PCT/JP2009/059369, filed on May 21, 2009.

(30) Foreign Application Priority Data

May 29, 2008 (JP) ................................. 2008-140305

(51) Int. Cl.
*H01L 21/70*    (2006.01)

(52) U.S. Cl.
USPC .................................. 257/368; 257/E29.201

(58) Field of Classification Search
USPC ...... 257/213, 288, 368, 369, E29.2, E29.201, 257/E29.257, E29.26; 438/270, 272, 274, 438/275
See application file for complete search history.

(56) References Cited

U.S. PATENT DOCUMENTS

| | | | |
|---|---|---|---|
| 6,252,266 B1 | 6/2001 | Hoshi et al. | |
| 2005/0009328 A1* | 1/2005 | Park et al. | 438/666 |
| 2008/0081477 A1* | 4/2008 | Ikeda | 438/694 |
| 2009/0238000 A1* | 9/2009 | Juengling | 365/185.13 |

FOREIGN PATENT DOCUMENTS

| | | |
|---|---|---|
| JP | 5-343385 A | 12/1993 |
| JP | 8-148570 A | 6/1996 |
| JP | 2000-058559 A | 2/2000 |
| JP | 2000-138236 A | 5/2000 |

OTHER PUBLICATIONS

International Search Report of PCT/JP2009/059369, mailing date Aug. 18, 2009.

* cited by examiner

*Primary Examiner* — Brook Kebede
(74) *Attorney, Agent, or Firm* — Westerman, Hattori, Daniels & Adrian, LLP (57) ABSTRACT

A semiconductor device includes a substrate having a rectangular shape, and a via hole that has an elliptic shape or a track shape having a linear portion in a long-axis direction of the track shape, a long axis of the elliptic shape or the track shape being arranged in a long-side direction of the substrate.

16 Claims, 7 Drawing Sheets

SEMICONDUCTOR DEVICE

CROSS-REFERENCE TO RELATED APPLICATION

This application is based upon and claims the benefit of priority of the prior Japanese Patent Application No. 2008-140305, filed on May 29, 2008, and is a continuation application of PCT/JP2009/059369, filed on May 21, 2009, the entire contents of which applications are incorporated herein by reference.

BACKGROUND (i) Technical Field

The present invention relates to semiconductor devices, and more particularly, to a semiconductor device having a substrate having a via hole.

(i) Related Art

A via hole may be formed in a substrate on which a semiconductor element such as an FET (Field Effect Transistor) is formed so as to communicate with the front surface of the substrate and the back surface thereof. The inner surface of the via hole is coated with a metal layer, and an electric connection with a semiconductor element may be made via the via hole from the back surface of the substrate. It is thus possible to reduce the parasitic impedance in the electric connection with the semiconductor element.

Japanese Patent Application Publication No. 2000-138236 discloses a substrate having a via hole having an elliptic shape.

However, a crack may be generated in the substrate with the via hole by stress applied to the substrate due to a temperature cycle or a warpage of a mounting board on which the substrate is mounted. An increased size of via hole attempted to suppress the crack generated in the substrate increases the chip area.

SUMMARY OF THE INVENTION

The present invention has been made in view of the above problems, and aims at providing a semiconductor device capable of suppressing a crack generated in a substrate due to a via hole and reducing the chip area.

According to an aspect of the present invention, there is provided a semiconductor device including: a substrate having a rectangular shape; and a via hole that has an elliptic shape or a track shape having a linear portion in a long-axis direction of the track shape, a long axis of the elliptic shape or the track shape being arranged in a long-side direction of the substrate.

DETAILED DESCRIPTION

Figure 1A:
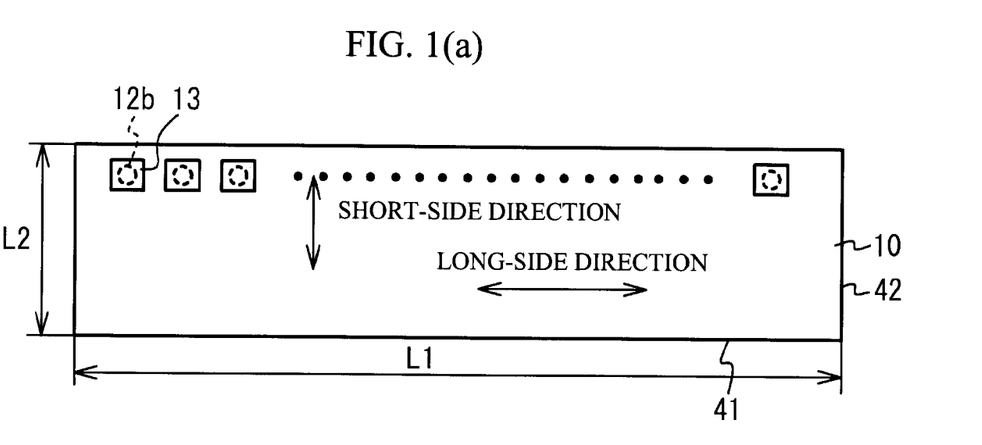
FIG. 1(a) is a plan view of a chip used in an experiment.

First, a description will be given of an experiment conducted in order to describe the principle of the present invention. FIG. 1(a) is a plan view of a chip used in the experiment. Referring to FIG. 1(a), 15 via holes 12b are aligned along a long side 41 of an SiC substrate 10, which has a thickness of about 100 μm, the long side 41 having a length L1 of about 5 mm, and a short side 42 having a length L2 of about 1 mm. The via holes 12b have circular shapes viewed from the front surface thereof. The via holes 12b are provided so as to contact pads 13, which is made of Ni and is provided on the front surface of the substrate 10. The back surface of the substrate 10 and the inner surfaces of the via holes 12b are coated with a metal film (not illustrated), which is approximately 10 μm thick.

Samples that have different sizes for every 100 samples were produced for the experiment. The chips produced were mounted on mounting boards made of Cu by using AuSn. The mounting boards with the chips being mounted thereon were subjected to a temperature cycle test. The temperature cycle test was carried out so that a temperature cycle between −65° C. and 150° C. was applied 500 times.

Figure 2:
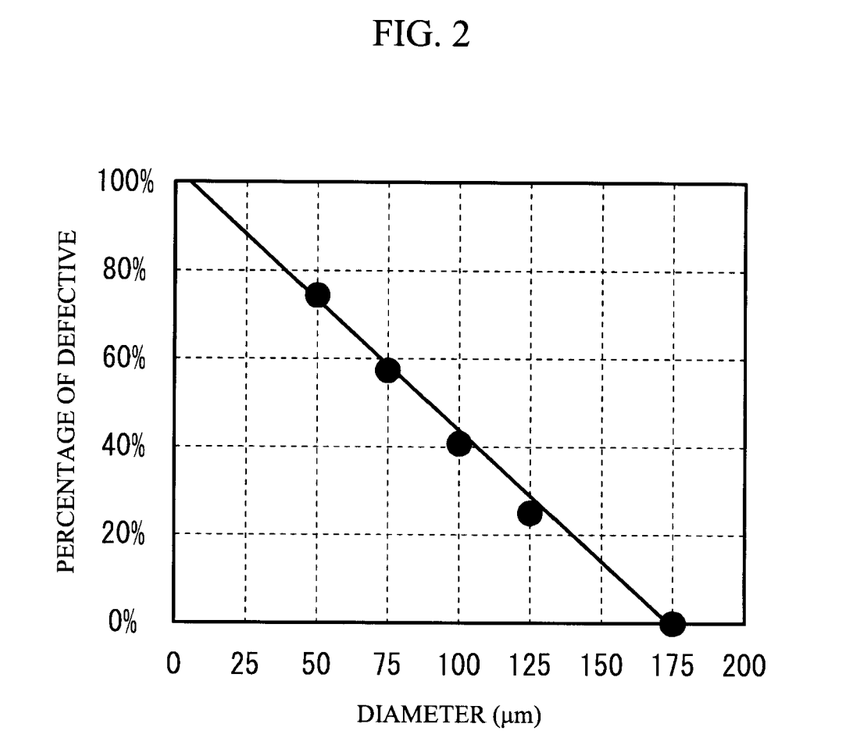
FIG. 2 is a graph that illustrates the ratio of defective with regard to the diameter of a via hole.

Table 1 shows results of the temperature cycle test of the samples with the circular via holes 12b. In the test, 100 samples were tested for every thickness, and a sample in which a crack was generated in the substrate 10 was classified into defective. The number of defectives indicates the number of samples classified into defective, and the percent of defective indicates [(the number of defectives)/(the number of samples tested)]×100%. FIG. 2 is a diagram that describes the percentage of defective to the diameter of the via holes 12b. Solid circles indicate experimental values, and a solid line indicates approximate values.

TABLE 1

| Diameter (μm) | Number of samples tested | Number of defectives | Percentage of defective |
| --- | --- | --- | --- |
| 50 | 100 | 75 | 75 |
| 75 | 100 | 58 | 58 |
| 100 | 100 | 40 | 40 |
| 125 | 100 | 25 | 25 |
| 175 | 100 | 0 | 0 |

It is considered that the defectives by the temperature cycle test result from thermal stress due to the thermal expansion ratios of the substrate 10 and the mounting substrate and warpage of the mounting substrate. It is seen from Table 1 and FIG. 2 that the via holes having greater diameters have smaller percentages of defective. This means that the greater the curvature of the via hole 12b, the less possibility the crack is generated. However, the use of the via holes having great diameters increases the chip area.

Figure 1B:
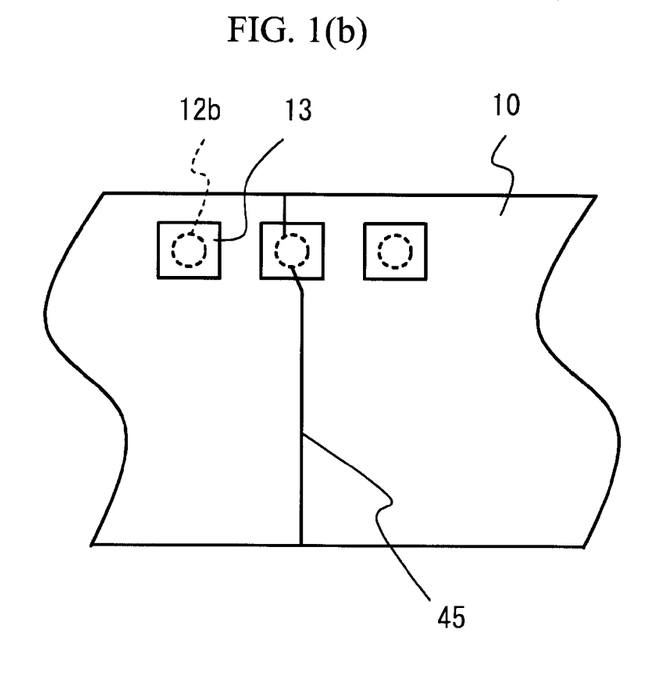
FIG. 1(b) is a schematic plan view that illustrates a crack generated.

FIG. 1(b) is a schematic plan view of an exemplary sample in which a crack is generated. The present inventors paid attention to a phenomenon in which a crack 45 in the rectangular substrate 10 is generated from a certain via hole 12b in a short-side direction of the rectangular substrate 10. This may be caused by greater stress applied to the short side 42 than that applied to the long side 41. Thus, the inventors supposed that the crack generated in the substrate 10 may be suppressed by forming a portion in which a crack on the via hole 12b is likely to be easily generated into a curve having a large curvature or a linear line, while the chip area may be reduced by forming another portion having difficulty in cracking into a small curvature.

Figure 3A:
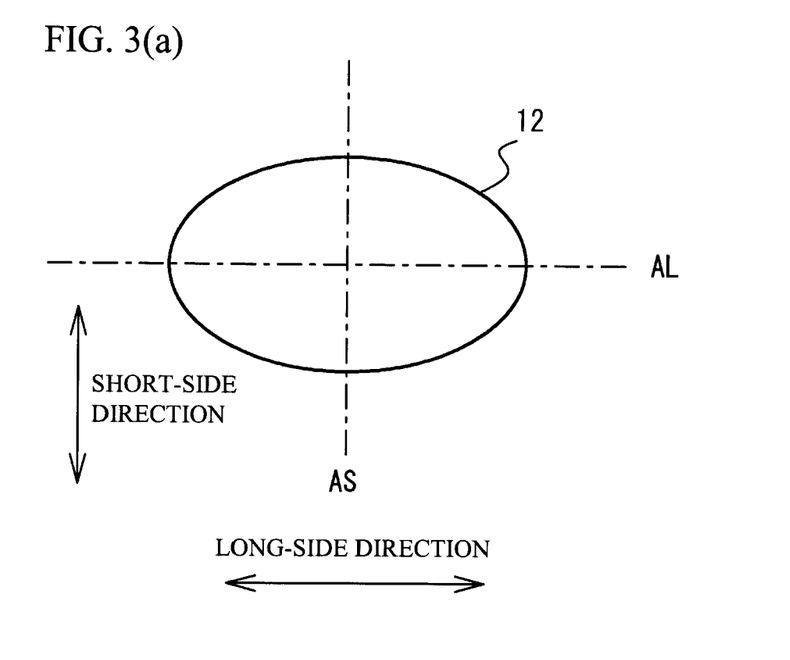
FIGS. 3(a) and 3(b) are diagrams of via holes viewed from the fronts of the via holes.

FIGS. 3(a) and 3(b) are diagrams that illustrate via holes that suppress a crack generated in the substrate. Referring to FIG. 3(a), a via hole 12 has an elliptic shape. A long axis AL of the elliptic shape is arranged in the long-side direction of the rectangular substrate. Thus, the via hole 12 is formed with a curve having a large curvature in opposite boundaries of the via hole 12 in the short-side direction of the substrate 10 in which a crack is likely to be easily generated, and is formed with another curve having a small curvature in opposite boundaries of the via hole 12 in the long-side direction of the substrate 10 having difficulty in cracking. It is thus possible to suppress generation of a crack in the substrate 10 and reduce the chip area.

Figure 3B:
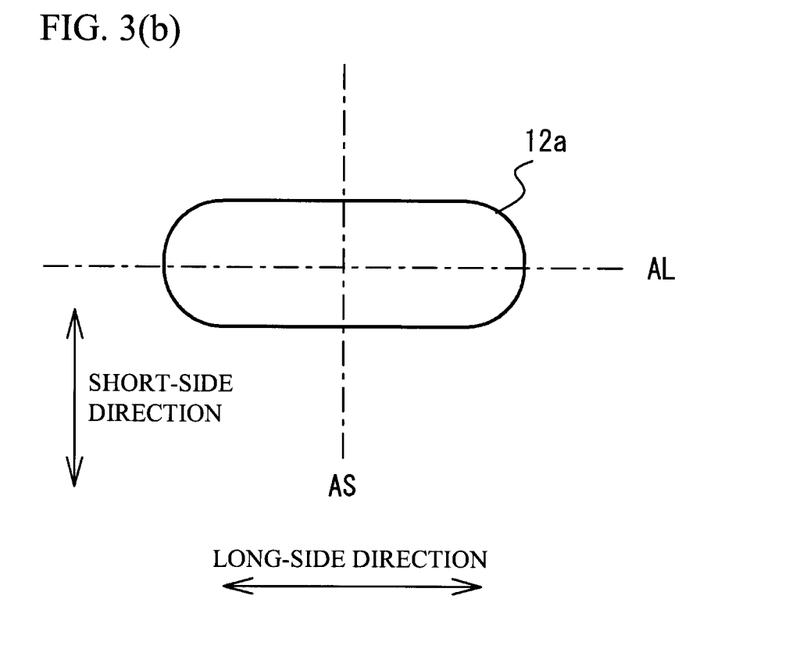

Referring to FIG. 3(b), a via hole 12a may have a track shape, for example. The track shape is defined so that the via hole 12a is formed with a linear line in opposite boundaries of the via hole 12a in the short-side direction of the substrate 10 in which a crack is likely to be easily generated (that is, the via hole 12 has the linear portions extending in the long-axis direction), and is formed with a curve in opposite boundaries of the via hole 12a in the long-side direction of the substrate 10 having difficulty in cracking.

As illustrated in FIGS. 3(a) and 3(b), the substrate 10 has the via hole 12 or 12a having a long shape viewed from the surface thereof, and the long-side axis of the via hole 12 or 12a is arranged in the long-side direction of the substrate 10. It is thus possible to suppress a crack generated in the substrate 10 due to the via hole 12 or 12a and to reduce the chip area.

A description will now be given of embodiments of the present invention with reference to the drawings.

Embodiment 1

Figure 4A:
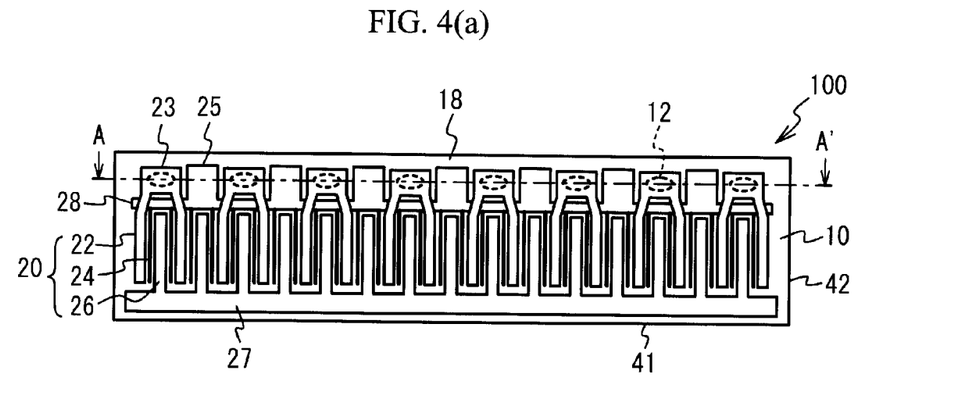
FIG. 4(a) is a plan view of a semiconductor device in accordance with an embodiment 1.
Figure 4B:
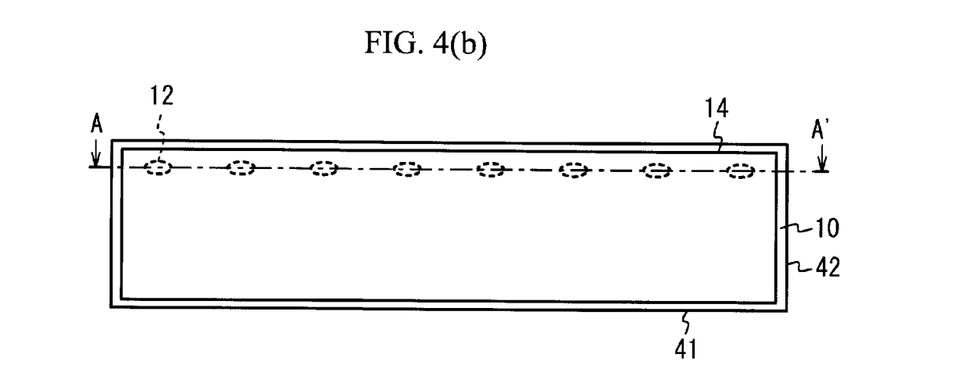
FIG. 4(b) is a bottom view thereof.
Figure 4C:
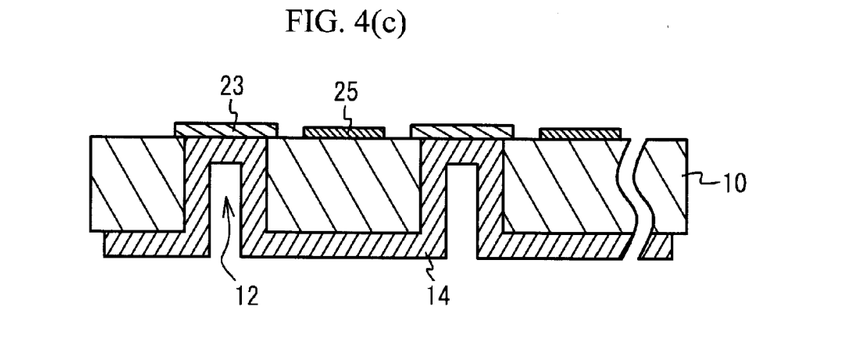
FIG. 4(c) is a cross-sectional view taken along a line A-A' in FIGS. 4(a) and 4(b).

An embodiment 1 is an example configured to have an FET as a semiconductor element. FIG. 4(a) is a plan view of a semiconductor device in accordance with the embodiment 1, FIG. 4(b) is a bottom view thereof, and FIG. 4(c) is a cross-sectional view taken along a line A-A' in FIGS. 4(a) and 4(b).

Referring to FIG. 4(a), a chip 100 has the SiC substrate 10. The SiC substrate 10 has a rectangular shape viewed from the surface thereof. A semiconductor element 18 is formed on the surface of the substrate 10. The semiconductor element 18 has a unit FET 20 having a source finger 22, a drain finger 26 and a gate finger 24, and has multiple unit FETs 20 arranged side by side.

The source finger 22, the drain finger 26 and the gate finger 24 are provided in a direction in which the short sides 42 of the substrate 10 extend (the short-side direction). The source finger 22, the drain finger 26 and the gate finger 24 are respectively connected to a source pad 23, a drain pad 27 and a gate bus bar 28. The source pad 23, the drain pad 27 and the gate bus bar 28 are respectively arranged in the directions in which the source finger 22, the drain finger 26 and the gate finger 24 extend. The source finger 22 crosses over the gate bus bar 28 via a gap defined on the gate bus bar 28. That is, an air bridge structure is realized. Gate pads 25 are connected to the gate bus bar 28. The drain pad 27 and the gate pads 25 are areas for wire bonding.

The source finger 22 I connected to one source pad 23, and the via hole 12 is formed below the source pad 23. Thus, the source finger 22 is connected to the via hole 12 via the source pad 23. The via hole 12 has an elliptic shape, and is provided in a direction in which the long axis of the elliptic shape extends in the direction in which the long sides 41 of the rectangular substrate 10 extends (the long-side direction). The FET 20 may have a GaN travel layer, an AlGaN electron supply line, and a GaN cap layer sequentially formed on the SiC substrate 10. The source finger 22 and the drain finger 26 may be made of metals such as Ti/Al formed on the GaN cap travel layer in which Ti is closer to the GaN cap travel layer. The gate finger 24 may be made of metals such as Ni/Au formed on the GaN cap layer in which Ni is closer to the GaN cap layer.

Referring to FIG. 4(b), the metal film 14 made of Ti/Au or the like is formed on the back surface of the substrate 10 in which Ti is closer to the substrate 10. Referring to FIG. 4(c), the via holes 12 pass through the substrate 10 to connect the front surface of the substrate 10 and the back surface thereof, and the inner surfaces of the via holes 12 are coated with the metal film 14.

As in the case of the embodiment 1, in the FET with the unit FETs 20 arranged side by side, an attempt to increase the gate width is urged to form the substrate in a reed shape. Further, the FET with a long gate width needs the substrate 10 made thin for heat radiation. Thus, a crack is likely to be easily generated in the substrate 10, and it is thus effective to use the via holes 2 having the long shape.

In the embodiment 1, the exemplary structure in which the via holes 12 are connected to the corresponding source fingers 22 has been described. The source impedance may be reduced by connecting the via holes 12 to the source fingers 22. Each via hole 12 may be connected to at least one of the source finger 22, the drain finger 26 and the gate finger 24. Although the FET has been described as the semiconductor element 18 in the embodiment, it is enough to connect the via holes 12 to the semiconductor element 18. Only one via hole 12 may be employed rather than the multiple via holes 12.

Embodiment 2

Figure 5:
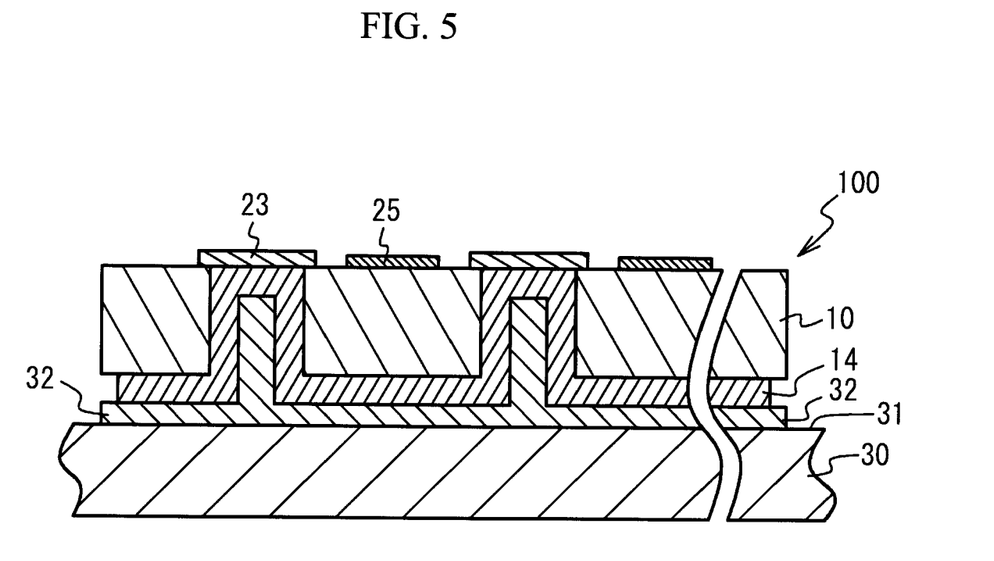
FIG. 5 is a cross-sectional view of a semiconductor device in accordance with an embodiment 2.
Figure 6A:
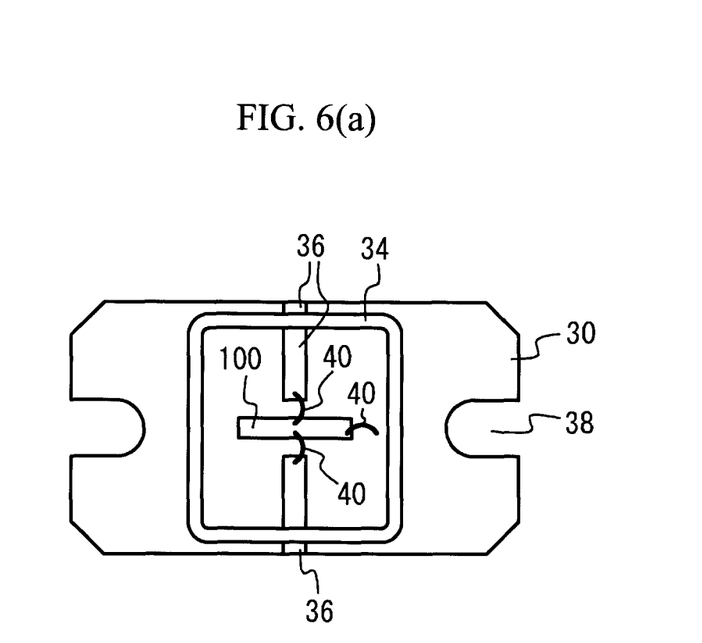
FIG. 6(a) is a plan view of the semiconductor device in accordance with the embodiment 2.

An embodiment 2 is an example in which the chip of the embodiment 1 is mounted on a mounting board. FIG. 5 is a cross-sectional view of the embodiment 2. FIG. 6(a) is a plan view of an electronic component involved in the embodiment 2 screwed to a substrate. Referring to FIG. 5, the chip 100 of the embodiment 1 is mounted on a mount surface of a mounting board 30 made of, for example, Cu by using a metal 32 made of AuSn for bonding. Besides AuSn, the metal 32 for bonding may be Ag paste or solder, for example. Besides the mounting board made of Cu, it is possible to use a single layer of an alloy (MoCo) of Cu and Mo, a single layer of an alloy (CoW) of Cu and W, a mounting board having multiple stacked layers of Cu and Mo or a mounting board having multiple stacked layers of Cu and CoMo.

Figure 6B:
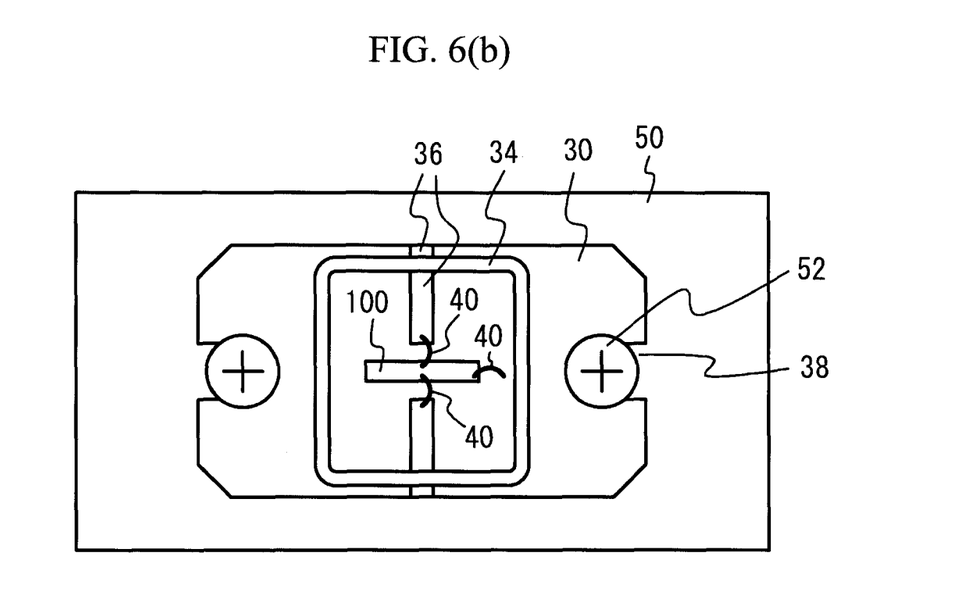
FIG. 6(b) is a plan view of the semiconductor device screwed to a substrate.

Referring to FIG. 6(a), on the mounting board 30, there are provided a frame 34 for hermetically sealing the chip 100, and a transmission line 36 for input signals to the chip 100 from the outside of the frame 34 and outputting signals from the chip 100 to the outside of the frame 34. The transmission line 36 are connected to a gate pad and a drain pad of the chip 100 by respective bonding wires 40. A source pad of the chip 100 is connected to the surface of the mounting board 30 by the corresponding bonding wire 40. Set back portions 38 for screwing are provided at opposite ends of the mounting board 30. Referring to FIG. 6(b), an electronic component of the embodiment 2 is fixed to a substrate 50 made of a metal such as Cu by screws 52. Thus, the mounting board 30 is electrically and thermally connected to the substrate 50.

As illustrated in FIGS. 5 and 6(a), in the case where the mounting board 30 is made of metal (particularly, a metal including Cu), there is a great difference in the linear thermal expansion ratio between the mounting board 30 and the substrate 10. Thus, cracking is likely to be easily generated in the substrate 10 due to thermal stress, and it is thus effective to use the via hole having the long shape.

As illustrated in FIG. 6(b), in a case where the mounting board 30 is screwed to the substrate 50, a crack is likely to be easily generated due to warpage of the mounting board 30. It is thus effective to employ the via hole having the long shape.
Embodiment 3

Figure 7:
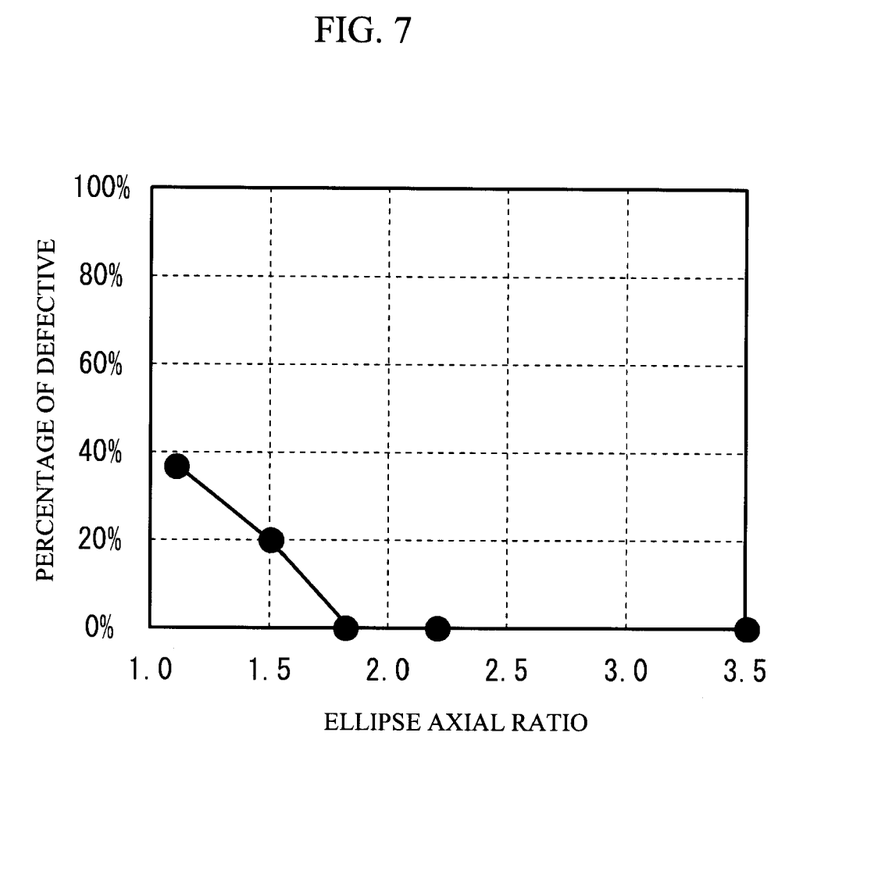
FIG. 7 is a graph of the ratio of defective with respect to an ellipse axial ratio of a via hole.

As in the case of FIG. 1, multiple samples with via holes having elliptic shapes were produced for the experiment, which were subjected to the temperature cycle test. The samples produced for the experiment had long-axis lengths/short-axis lengths of the over shapes (ratio of the long axis to the short axis) of about 80 μm/70 μm, 90 μm/60 μm, 100 μm/55 μm, 110 μm/50 μm or 130 μm/40 μm. Table 2 illustrates results of the temperature cycle test of the samples of the elliptic via holes. FIG. 7 illustrates the percent of defective with regard to the ellipse axial ratio of the via hole (long-axis length/short-axis length).

TABLE 2

| Long axis/short axis (μm) | Oval axial ratio | Number of samples | Number of defectives | Percentage of defective (%) |
|---|---|---|---|---|
| 80/70 | 1.14 | 100 | 37 | 37 |
| 90/60 | 1.50 | 100 | 21 | 21 |
| 100/55 | 1.81 | 100 | 0 | 0 |
| 110/50 | 2.20 | 100 | 0 | 0 |
| 130/40 | 3.25 | 100 | 0 | 0 |

The via holes having a diameter of 75 μm in Table 1 have a percentage of defective of 58%, while the via holes having an ellipse axial ratio of 1.14 and thus having almost the same size as that of the above via holes have a considerably reduced percentage of defective of 37%, as indicated by Table 2 and FIG. 7. As described above, the percentage of defective is decreased when the ellipse axial ratio is equal to or greater than 1.1. The percentage of defective is further reduced when the ellipse axial ratio is equal to or greater than 1.5. When the ellipse axial ratio is equal to or greater than 1.8, the percentage of defective is zero. From the above, it is preferable that the long axis/short axis of the via holes 12 is equal to or greater than 1.1. The long axis/short axis of the via holes 12 is more preferably equal to or greater than 1.5, and is much more preferably equal to or greater than 1.8. When manufacturing variation is taken into consideration, the long axis/short axis of the via holes 12 is furthermore preferably equal to or greater than 2.2. Preferably, the ellipse axial ratio of the via holes 12a having the track shape illustrated in FIG. 3(b) is equal to or greater than 1.1 like the via holes 12.

In the embodiments 1 and 2, the semiconductor element is mounted on the SiC substrate 10. The substrate 10 may, for example, be a substrate made of any of SiC, Si, sapphire, GaN, GaAs and InP. Particularly, the substrate made of SiC, sapphire or GaN has a high degree of hardness, and a crack is likely to be easily generated in the substrate 10. Thus, it is effective to use the via holes having the long shape.

Although the preferred embodiments of the invention have been described, the present invention is not limited to these specific embodiments but various variations and changes may be made without departing from the scope of the claimed invention.

The invention claimed is:

1. A semiconductor device comprising:
   a substrate having a rectangular shape; and
   a via hole that has an elliptic shape, a long axis of the elliptic shape being arranged in a long-side direction of the substrate; wherein;
   a semiconductor element formed on a surface of the substrate has multiple unit FETs each having a source finger, a drain finger and a gate finger, the multiple unit FETs being connected in parallel;
   at least one of the source finger, the drain finger and the gate finger is connected to the via hole; and
   the source finger, the drain finger and the gate finger are provided in a short-side direction of the substrate.

2. The semiconductor device according to claim 1, wherein multiple via holes, each being configured like said via hole, are aligned in the long-side direction of the substrate.

3. The semiconductor device according to claim 1, wherein multiple source fingers are provided to one source pad, and the via hole is formed below the one source pad.

4. The semiconductor device according to claim 1, wherein a ratio of the long axis of the via hole to a short axis is equal to or greater than 1.1.

5. The semiconductor device according to claim 1, wherein a ratio of the long axis of the via hole to a short axis is equal to or greater than 1.5.

6. The semiconductor device according to claim 1, wherein the substrate comprises any of SiC, Si, sapphire, GaN, GaAs and InP.

7. The semiconductor device according to claim 1, further comprising a mounting surface on which the substrate is mounted via a metal for bonding made of any of AuSn, Ag paste and solder.

8. The semiconductor device according to claim 7, wherein the mounting surface is defined by any of Cu, CuMo, CuW, a stacked layer of Cu and Mo, and a stacked layer of Cu and CuMO.

9. A semiconductor device comprising:
   a substrate having a rectangular shape; and
   a via hole that has a track shape having a linear portion in a long-axis direction of the track shape, a long axis of the track shape being arranged in a long-side direction of the substrate, wherein;
   a semiconductor element formed on a surface of the substrate has multiple unit FETs each having a source finger, a drain finger and a gate finger, the multiple unit FETs being connected in parallel;
   at least one of the source finger, the drain finger and the gate finger is connected to the via hole; and
   the source finger, the drain finger and the gate finger are provided in a short-side direction of the substrate.

10. The semiconductor device according to claim 9, wherein multiple via holes, each being configured like said via hole, are aligned in the long-side direction of the substrate.

11. The semiconductor device according to claim 9, wherein multiple source fingers are provided to one source pad, and the via hole is formed below the one source pad.

12. The semiconductor device according to claim 9, wherein a ratio of the long axis of the via hole to a short axis is equal to or greater than 1.1.

13. The semiconductor device according to claim 9, wherein a ratio of the long axis of the via hole to a short axis is equal to or greater than 1.5.

14. The semiconductor device according to claim 9, wherein the substrate comprises any of SiC, Si, sapphire, GaN, GaAs and InP.

15. The semiconductor device according to claim 9, further comprising a mounting surface on which the substrate is mounted via a metal for bonding made of any of AuSn, Ag paste and solder.

16. The semiconductor device according to claim 15, wherein the mounting surface is defined by any of Cu, CuMo, CuW, a stacked layer of Cu and Mo, and a stacked layer of Cu and CuMO.

* * * * *